(12) United States Patent
Yumoto

(10) Patent No.: US 6,498,115 B1
(45) Date of Patent: Dec. 24, 2002

(54) METHOD FOR MANUFACTURING CIRCUIT COMPONENT

(75) Inventor: Tetsuo Yumoto, Tokorozawa (JP)

(73) Assignee: Sankyo Kasei Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/900,908

(22) Filed: Jul. 9, 2001

(51) Int. Cl.⁷ ................................................ H01L 21/31
(52) U.S. Cl. ........................ 438/784; 438/758; 438/720; 438/631; 437/194; 437/195; 156/629; 156/633; 156/634; 156/636
(58) Field of Search ................................. 438/784, 758, 438/631, 720; 437/194, 195; 156/634, 629, 633, 636

(56) References Cited

U.S. PATENT DOCUMENTS 4,839,960 A * 6/1989 Yokoi et al. .................. 29/620
5,581,875 A * 12/1996 Hibino et al. .................. 29/840
5,616,956 A * 4/1997 Horiguchi et al. .......... 257/703

FOREIGN PATENT DOCUMENTS

JP 11-17442 1/1999

* cited by examiner

Primary Examiner—Richard Elms
Assistant Examiner—Pho M. Luu
(74) Attorney, Agent, or Firm—Jordan and Hamburg LLP

(57) ABSTRACT

After forming a conductive layer on the entire surface of an insulation substrate, a resin mask of poly lactic acid etc. resin which will hydrolyze in an alkali aqueous solution is integrally formed on the insulation substrate so that a part to which a conductive layer of a predetermined pattern is to be formed is exposed. Then, a conductive layer is overlaid on the part exposed from the resin mask by means of electrolytic plating using an acidic bath composition. The interface between the resin mask of poly lactic acid etc. resin and the conductive layer reproduces an accurate contour of the pattern. Thereafter, the resin mask is efficiently removed by hydrolysis using an alkali aqueous solution, and finally the conductive layer is removed by chemical etching to thereby form a conductive layer having the predetermined pattern on the surface of the insulation substrate.

14 Claims, 3 Drawing Sheets

METHOD FOR MANUFACTURING CIRCUIT COMPONENT

BACKGROUND OF THE INVENTION

The present invention relates to a method for manufacturing a circuit component such as circuit substrate or connector, which is partially plated.

Conventionally, as a method for forming a circuit board on a dielectric substrate, there is known a method comprising the steps of: forming a dielectric substrate in a predetermined shape out of a dielectric material; forming a conductive layer consisting of a conductive material on the entire surface of the dielectric substrate by nonelectrolytic plating; forming a resin mask on the dielectric substrate so that a surface part where a conductive layer of a predetermined pattern is to be formed is covered and the remaining surface part is exposed in the surface of the dielectric substrate on which the conductive layer has been formed; etching the integral piece of the dielectric substrate and the resin mask to remove the conductive part on the dielectric substrate that is not covered with the resin mask; and removing the resin mask from the integral piece of the dielectric substrate and the resin mask that has been etched, thereby forming a conductive layer of a predetermined pattern on the surface of the dielectric substrate (Publication of unexamined Japanese Patent Application No. Hei 11(1999)-17442). Then, since the resin mask is manually removed by using a tab that has been formed integrally with the resin mask, the efficiency of mask removing is extremely poor in this conventional example.

BRIEF SUMMARY OF THE INVENTION

In view of the above, it is an object of the invention to provide a method for manufacturing a circuit component in which efficiency of mask removing is improved, the contour of a pattern along the mask is easily and accurately reproduced, and the productivity is improved.

Also, it is another object of the invention to provide a method for manufacturing a circuit component which enables accurate and economical patterning by forming on a conductive substrate a pattern of a conductive layer having different properties from the substrate, and applying a resin mask in the case of components having a highly spatial shape such as connectors.

A brief description of the invention relating to a method for manufacturing a circuit component is as follows. That is, the method comprises the steps of: forming an insulation substrate in a predetermined shape out of an insulation material; forming a conductive layer of a conductive material on the entire surface of the aforementioned insulation substrate as a primary plating by nonelectrolytic plating; integrally forming a resin mask of a material having the property of hydrolyzing in an alkali aqueous solution and of resisting an acidic aqueous solution on the insulation substrate by forming the resin mask so that in the surface of the insulation substrate formed with the conductive layer, the part to which a conductive layer of a predetermined pattern is to be formed is exposed; overlaying a conductive layer by means of electrolytic plating with an acidic bath composition on the exposed part as a secondary plating; removing the resin mask by hydrolysis using an alkali aqueous solution; and removing the conductive layer of the primary plating by chemical etching, thereby forming a conductive layer of the predetermined pattern on the insulation substrate. The above material of resin mask has a property of hydrolyzing by an alkali aqueous solution and resists to an acidic aqueous solution, examples of which including saturated fatty acid esterified starch, poly lactic acid, aliphatic polyester, or a mixture or a copolymer of poly lactic acid and aliphatic polyester.

As described above, since the resin mask having the property of hydrolyzing in an alkali aqueous solution and of resisting an acidic aqueous solution is integrally formed on the insulation substrate, and the resin mask is removed by hydrolysis using an alkali aqueous solution, it is possible to remove the resin mask with high efficiency.

Another brief description of the invention relating to a method for manufacturing a circuit component is as follows. The method comprises the steps of: forming a conductive substrate in a predetermined shape out of a conductive material; integrally forming a resin mask on the conductive substrate so that a part to which a conductive layer having a predetermined pattern is to be formed is exposed; overlaying a conductive layer of the predetermined pattern having a different property from the conductive substrate on the surface of the conductive substrate by electrolytic plating with an acidic bath composition with respect to the exposed part; and removing the resin mask by hydrolysis using an alkali aqueous solution. Also the above material of resin mask has a property of hydrolyzing by an alkali aqueous solution and resists to an acidic aqueous solution, examples of which including saturated fatty acid esterified starch, poly lactic acid, aliphatic polyester, or a mixture or a copolymer of poly lactic acid and aliphatic polyester.

According to the present invention, it is possible to make patterning accurately and economically by employing a resin mask in the case of components having a complicated three-dimensional shape such as connectors.

DETAILED DESCRIPTION OF THE INVENTION

Now the first embodiment of the present invention will be explained with reference to FIG. 1. This embodiment is a method for manufacturing a circuit component in which a conductive layer of a conductive material having a predetermined pattern is formed on the surface of an insulation substrate of an insulation material having a predetermined shape, and the method comprises the steps as follows.

Figure 1A:
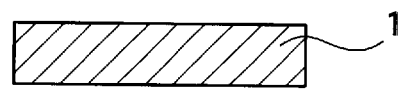
FIGS. 1(A) to (G) are section views showing step by step the forming process of a formed circuit component according to the first embodiment.
Figure 1B:
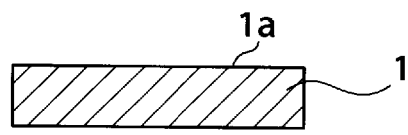
Figure 1C:
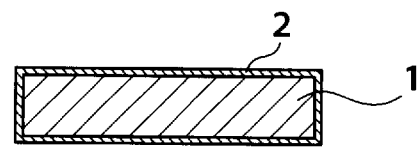

As shown in FIG. 1(A), an insulation substrate 1 is formed in a predetermined shape out of an insulation material by primary injection molding. As shown in FIG. 1(B), the surface of the insulation substrate 1 is pretreated with a catalyst for plating 1*a* by using palladium, gold and the like after the surface is etched. Next, as shown in FIG. 1(C), a conductive layer 2 of a conductive material is formed on the entire surface of the insulation substrate 1__by nonelectrolytic plating as a primary plating.

Figure 1D:
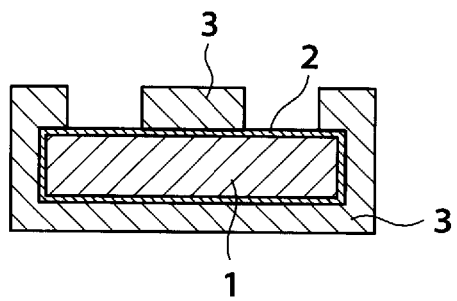

Then the process proceeds to the secondary molding step. In this step, as shown in FIG. 1(D), a resin mask 3 is integrally formed on the insulation substrate by setting the insulation substrate 1 on which the conductive layer has been formed by the primary plating in an injection molding die, and by injecting a resin such as poly lactic acid into the cavity so as to allow the resin mask 3 to be formed so that a part to which a conductive layer 4 having a predetermined pattern is to be formed in the surface of the insulation substrate 1 (See FIGS. 1E to G) is exposed. This material of the resin mask 3 has the property of hydrolyzing in an alkali aqueous solution and resists an acidic aqueous solution, examples of which including saturated fatty acid esterified starch, poly lactic acid, aliphatic polyester, or a mixture or a copolymer of poly lactic acid and aliphatic polyester (hereinafter, referred to as poly lactic acid etc. resin).

Saturated fatty acid esterified starch, poly lactic acid and aliphatic polyester may be used separately as the material of the resin mask. The poly lactic acid may be used in being mixed with single or plural aliphatic polyester(s), random-copolymerized or block-copolymerized with aliphatic polyester. Further, as the need arises, additives such as alkalinolysis promoters, organic and inorganic fillers, and coloring agents, all of which are applicable in general to synthetic resins, may also be mixed. The aliphatic polyester includes a kind of aliphatic polyester comprising polyhydroxy carboxylic acid, hydroxy carboxylic acid and aliphatic poly basic acid. It may also include a random copolymer, block copolymer or the like, which comprises plural kinds of monomer-components, ones of which are selected from hydroxy carboxylic acids and aliphatic polyhydric alcohols and the others of which are selected from aliphatic poly basic acids. It is preferred that the mixing or copolymerization amount of poly lactic acid and aliphatic polyester is about 1 to 10% by weight with respect to the total amount of the mixture or a copolymer. The mixing amount of alkalinolysis promoter is about 1 to 100% by weight with respect to the total amount of the mixture. Furthermore, the composition formula of saturated fatty acid esterified starch is $H[C_6H_{10}O_5]m[OCO(CH_2)_{0-16}CH_3]n$.

Figure 1E:
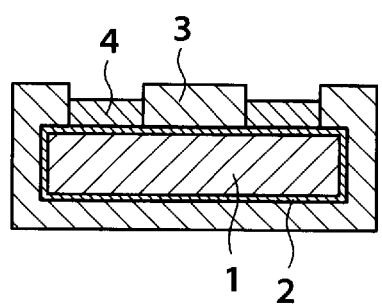

Furthermore, as shown in FIG. 1(E), a conductive layer 4 is overlapped by means of electrolytic plating using an acidic bath composition as a secondary plating on the part exposed from the resin mask molded 3 of a poly lactic acid etc. resin. The thickness of the conductive layer 4 of secondary plating is 2 to 5 times larger than that of the conductive layer 2 of primary plating. As for the interface between the resin mask 3 of the poly lactic acid etc. resin and the conductive layer 4 of secondary plating, no chemical bond is generated between the resin mask 3 and the metallic plating. However, although they are not be bonded but just adhered, no plating will deposit at the interface because of the property of the electrolytic plating. Therefore, it is possible to make easily an accurate contour of the pattern along the resin mask. Moreover, using the electrolytic plating improves the deposition speed of plating compared to using the non-electrolytic plating, resulting in high productivity. As for using the electrolytic plating as the secondary plating, if the electrolytic plating is used for a plating to be overlaid subsequent to the secondary plating, it puts a shine on the plating surface and improves the wire bondability required in the fields of semiconductor package and the like.

Now explaining the acidic bath composition, a basic bath composition, for example, of copper sulfate bath is as follow:

| | |
|---|---|
| $CuSO_4.5H_2$ | 75 g/l |
| $H_2SO_4$ | 190 g/l |
| $Cl^-$ | 60 ppm |
| Additive | proper amount |

The property thereof is strongly acidic.

In addition, the cathode current density is 2.5 A/dm$^2$, the anode material is phosphorus containing copper, the bath temperature is 25° C., the physical property of the plating film is: tensile strength=30 to 35 kg/mm$^2$, elongation=12 to 20%, and evaluation of gloss and leveling is excellent.

Furthermore, the condition of copper sulfate plating adapting to high aspect ratio substrates is as follows.

| | Cathode current density | Bath composition (g/l) | |
|---|---|---|---|
| | (A/dm$^2$) | $CuSO_4.5H_2O$ | $H_2SO_4$ |
| High current bath | 2.1 to 3.0 | 60 to 80 | 170 to 190 |
| Medium current bath | 1.0 to 2.0 | 50 to 60 | 180 to 200 |
| Low current bath | 0.5 to 1.0 | 40 to 50 | 230 to 280 |

Figure 1F:
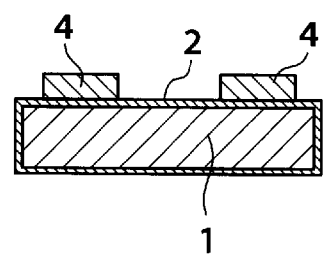

Furthermore, as shown in FIG. 1(F), the resin mask 3 of poly lactic acid etc. resin is removed by hydrolysis with the use of an alkali aqueous solution. That is, the resin mask is removed by immersion in a caustic alkali (such as NaOH, KOH) aqueous solution of the concentration of about 2 to 15% by weight and the temperature of about 25 to 70° C. for about 1 to 120 min. As described above, the poly lactic acid etc. resin has the property of hydrolyzing in an alkali aqueous solution and of resisting an acidic aqueous solution. Therefore, as it can easily decompose in an alkali aqueous solution, the work efficiency is significantly improved compared to the conventional manual mask removing.

Figure 1G:
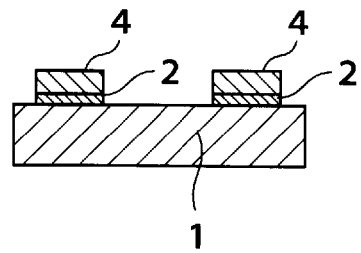

Finally, as shown in FIG. 1(G), the conductive layer 2 of primary plating is removed by chemical etching to form the conductive layer 4 having the predetermined pattern on the surface of the insulation substrate 1. At this time, in addition to making the conductive layer 4 of secondary plating thinner, the conductive layer 2 of primary plating that is not covered with this conductive layer 4, or a so-called under layer is removed.

Next, the second embodiment will be explained referring to FIG. 2.

The second embodiment is a method for manufacturing a circuit component, in which on the surface of a conductive substrate 10 of such as beryllium copper, a conductive layer 40 of gold or the like which has the difference in conductivity from the material of the substrate 10 is formed in a predetermined pattern. The second embodiment is different in that in the first embodiment the insulation substrate is formed out of an insulation material. Therefore, the second embodiment eliminates the necessity of forming the conductive layer 2 by the primary plating.

Figure 2A:
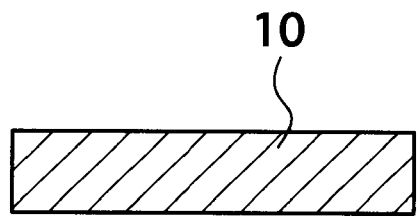
FIGS. 2(A) to (D) are section views showing step by step the forming process of a formed circuit component according to the second embodiment.

First, as shown in FIG. 2(A), a conductive substrate 10 is formed out of a conductive material such as beryllium copper in a predetermined shape by pressing.

Figure 2B:
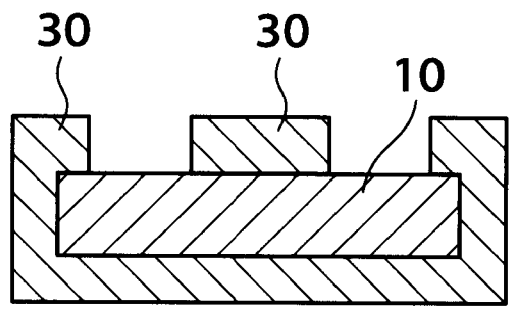
Figure 2C:
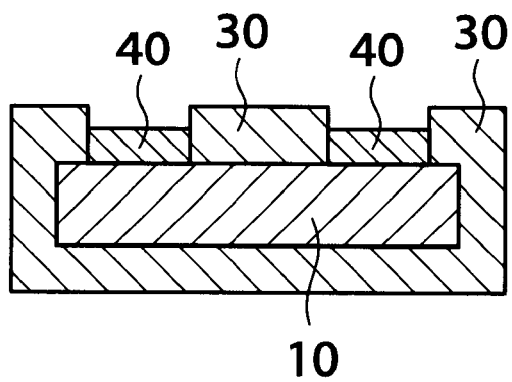

Next, as shown in FIG. 2(B), on this conductive substrate, a resin mask 30 of saturated fatty acid esterified starch, poly lactic acid, aliphatic polyester which are poly lactic acid etc. resins, or a mixture or a copolymer of poly lactic acid and aliphatic polyester is formed so that a part to which a conductive layer 40 having the predetermined pattern is to be formed in the surface of the conductive substrate 10 is exposed (See FIG. 2(C)). This poly lactic acid etc. resin is as same as that described in the previous embodiment.

Furthermore, as shown in FIG. 2(C), a conductive layer 40 in the prescribed pattern, of gold or the like, which is different in conductivity from the material of the conductive substrate 10, is overlaid on the exposed part of the conductive substrate 10 by means of electrolytic plating using the acidic bath composition. The acidic bath composition is the same as described in the first embodiment.

Figure 2D:
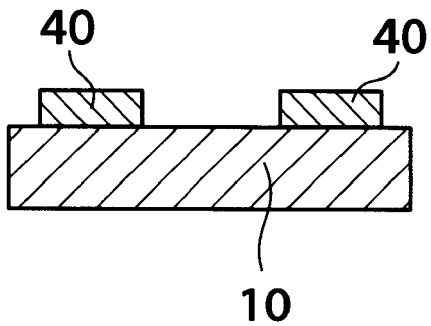
Figure 3A:
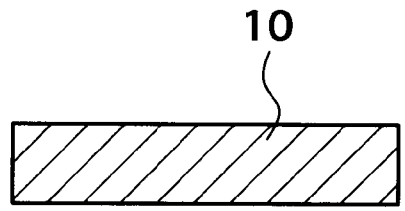
FIGS. 3(A) to (D) are section views showing step by step the forming process of a formed circuit component according to the third embodiment.
Figure 3B:
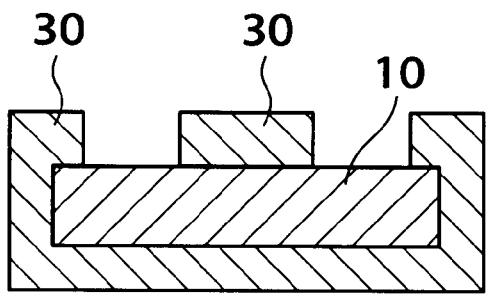
Figure 3C:
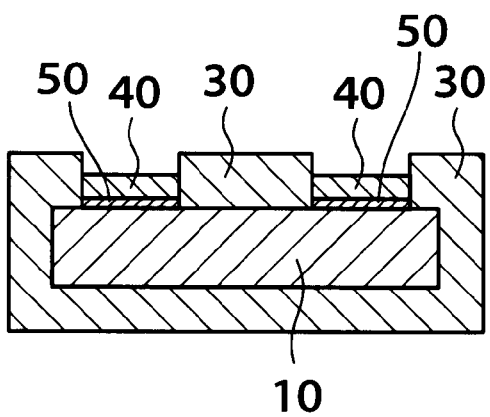
Figure 3D:
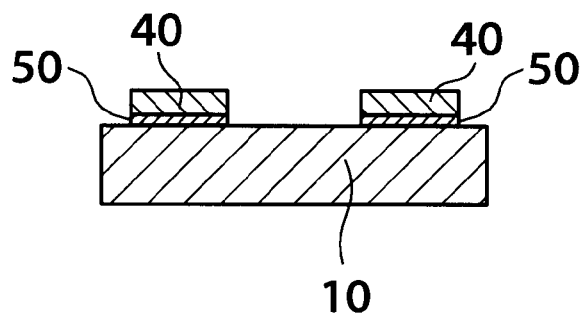

Finally, as shown in FIG. 2(D), after the resin mask 30 is removed by hydrolysis using an alkali aqueous solution, the conductive layer 40 of different property from that of the conductive substrate 10 is formed on the surface of the conductive substrate 10.

According to the present embodiment, in the case of components having a highly complicated three-dimensional shape such as connectors, it is possible to realize patterning accurately and economically by applying the resin mask. Furthermore, in the case of manufacturing a connector by the present embodiment, as beryllium copper, which is the material of the conductive substrate 10, has the property of being rich in spring, it is often used for electric connection by utilizing the elastic pressing force of its spring function.

However, as the beryllium copper does not have corrosion resistance to the environment such as air pollution, the surface thereof is easily oxidized. Oxidation will cause problems such as increase of conductive resistance and evolution of heat. Gold is often used because of its superior corrosion resistance and low electric resistance. However, as gold is expensive, gold plating is preferably made only on the contact-point, that is, the conductive layer 40 in the prescribed pattern.

Another problem caused by forming the conductive layer 40 of gold plating directly on the conductive substrate 10 of beryllium copper is that an alloy layer of solder and beryllium is generated while soldering a contactor for connector. This alloy layer has high electric resistance, causing power loss such as evolution of heat.

In view of this, in order to prevent generation of an alloy, or in order to prevent deterioration of conductivity, as shown in the third embodiment in FIG. 3, an intermediate layer 50 of nickel plating is formed on the beryllium copper. That is, nickel plating is made on the conductive substrate 10 to form the intermediate layer 50, and additionally, a gold plating 40 having different property from this substrate is made on the contact portion.

What is claimed is:

1. A method for manufacturing a circuit component in which a conductive layer of a conductive material having a predetermined pattern is formed on the surface of an insulation substrate having a predetermined shape of an insulation material, the method comprising the steps of:

forming the insulation substrate having a predetermine shape of the insulation material;

forming the conductive layer of a conductive material on the entire surface of the insulation substrate formed into the predetermined shape by nonelectrolytic plating as a primary plating;

integrally forming a resin mask of a material having the property of hydrolyzing in an alkali aqueous solution and resisting an acidic aqueous solution on the insulation substrate by forming the resin mask so that in the surface of the insulation substrate formed with the conductive layer, the part to which the conductive layer of the predetermined pattern is to be formed is exposed;

overlaying a conductive layer by means of electrolytic plating with an acidic bath composition on the exposed part as a secondary plating;

removing the resin mask by hydrolysis using an alkali aqueous solution; and removing the conductive layer of the primary plating by chemical etching, thereby forming the conductive layer of the predetermined pattern on the insulation substrate.

2. The method for manufacturing a circuit component according to claim 1, wherein the resin mask is formed of saturated fatty acid esterified starch.

3. The method for manufacturing a circuit component according to claim 1, wherein the resin mask is formed of poly lactic acid.

4. The method for manufacturing a circuit component according to claim 1, wherein the resin mask is formed of aliphatic polyester.

5. The method for manufacturing a circuit component according to claim 1, wherein the resin mask is formed of a mixture or a copolymer of poly lactic acid and aliphatic polyester.

6. The method for manufacturing a circuit component according to claim 1, wherein the conductive layer of the electrolytic plating as the secondary plating is achieved by an acidic bath composition.

7. The method for manufacturing a circuit component according to claim 1, wherein the conductive layer of the secondary plating is two to five times thicker than the conductive layer of the primary plating.

8. A method for manufacturing a circuit component in which on the surface of a substrate of a conductive material a predetermined conductive pattern having a different property from the substrate is formed, the method comprising the steps of:

forming a conductive substrate having a predetermined shape of a conductive material;

integrally forming a resin mask on the conductive substrate so that a part to which the conductive layer having the predetermined pattern is to be formed is exposed;

overlaying a conductive layer of the predetermined pattern having a different property from the conductive substrate on the surface of the conductive substrate by electrolytic plating with the use of an acidic bath composition; and removing the resin mask by hydrolysis using an alkali aqueous solution.

9. The method for manufacturing a circuit component according to claim 8, wherein the resin mask is formed of saturated fatty acid esterified starch.

10. The method for manufacturing a circuit component according to claim 8, wherein the resin mask is formed of poly lactic acid.

11. The method for manufacturing a circuit component according to claim 8, wherein the resin mask is formed of aliphatic polyester.

12. The method for manufacturing a circuit component according to claim 8 wherein the resin mask is formed of a mixture or a copolymer of poly lactic acid and aliphatic polyester.

13. The method for manufacturing a circuit component according to claim 12, wherein an intermediate layer of nickel plating is formed between the conductive substrate of beryllium copper and the conductive layer of gold plating.

14. The method for manufacturing a circuit component according to claim 8, wherein the conductive substrate is formed of beryllium copper and the conductive layer of the predetermined pattern is gold plating.

* * * * *